United States Patent
Saijo

(10) Patent No.: US 12,393,288 B2
(45) Date of Patent: Aug. 19, 2025

(54) INPUT DEVICE

(71) Applicant: ALPS ALPINE CO., LTD., Tokyo (JP)

(72) Inventor: Takayuki Saijo, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 18/787,041

(22) Filed: Jul. 29, 2024

(65) Prior Publication Data

US 2024/0385700 A1 Nov. 21, 2024

Related U.S. Application Data

(63) Continuation of application No. PCT/JP2023/004909, filed on Feb. 14, 2023.

(30) Foreign Application Priority Data

Mar. 15, 2022 (JP) .................... 2022-040659

(51) Int. Cl.
*G06F 3/0354* (2013.01)
*H05K 7/14* (2006.01)

(52) U.S. Cl.
CPC ....... *G06F 3/03543* (2013.01); *H05K 7/1427* (2013.01)

(58) Field of Classification Search
CPC .......................... G06F 3/03543; H05K 7/1427
USPC ........................................................ 345/163
See application file for complete search history.

(56) References Cited

U.S. PATENT DOCUMENTS

| 5,430,261 A * | 7/1995 | Malone | ................ H01H 23/003 200/1 B |
| 2021/0134542 A1* | 5/2021 | Hashimoto | .......... H01H 23/143 |

FOREIGN PATENT DOCUMENTS

| JP | S51-026371 U | 2/1976 |
| JP | 2006294322 A * | 10/2006 |
| JP | 2009-301854 | 12/2009 |
| JP | 2009301854 A * | 12/2009 |
| JP | 2021-072190 | 5/2021 |

OTHER PUBLICATIONS

International Search Report for PCT/JP2023/004909 mailed on May 9, 2023.

* cited by examiner

*Primary Examiner* — Mark Edwards
(74) *Attorney, Agent, or Firm* — IPUSA, PLLC

(57) ABSTRACT

An input device includes: a housing; an operation panel that includes an operation portion configured to receive touching and pressing from an operator, and is supported so as to be rockable relative to the housing; a substrate that is housed in the housing; an electrostatic detection electrode configured to detect the touching; and a pressure detector configured to detect the pressing. The operation portion includes a first operation portion configured to receive both of the touching and the pressing, and a second operation portion configured to receive only the touching without receiving the pressing. The input device includes a restrainer configured to differentiate operation that moves the operation panel toward the substrate upon pressing on the first operation portion from operation that moves the operation panel toward the substrate upon pressing on the second operation portion.

12 Claims, 16 Drawing Sheets

INPUT DEVICE

CROSS-REFERENCE TO RELATED APPLICATIONS

This application is a continuation application of International Application No. PCT/JP2023/004909, filed on Feb. 14, 2023, and designated the U.S., which is based upon and claims priority to Japanese Patent Application No. 2022-040659, filed on Mar. 15, 2022, the entire contents of which are incorporated herein by reference.

BACKGROUND

1. Field of the Invention

The present disclosure relates to an input device.

2. Description of the Related Art

Japanese Laid-Open Patent Application No. 2021-72190 discloses a seesaw switch including a case, a knob which includes two press operation portions and is operably locked to a housing by a fulcrum provided on a side wall of the case, and two switches.

SUMMARY

An input device according to one embodiment includes: a housing; an operation panel that includes an operation portion configured to receive touching and pressing from an operator, and that is supported so as to be rockable relative to the housing; a substrate that is housed in the housing; an electrostatic detection electrode configured to detect touching; and a pressure detector configured to detect the pressing. The operation portion includes a first operation portion configured to receive both touching and pressing, and a second operation portion configured to receive only touching without receiving the pressing. The operation portion includes a restrainer configured to differentiate operation that moves the operation panel toward the substrate upon pressing on the first operation portion from operation that moves the operation panel toward the substrate upon pressing on the second operation portion.

DETAILED DESCRIPTION OF THE PRESENT DISCLOSURE

According to the technique of Japanese Laid-Open Patent Application No. 2021-72190 mentioned above, there is a risk of misoperation of a switch when a portion of the switch that does not receive pressing is pressed mistakenly.

An embodiment of the present disclosure will now be described with reference to the drawings.

Configuration of the Input Device 100

Figure 1:
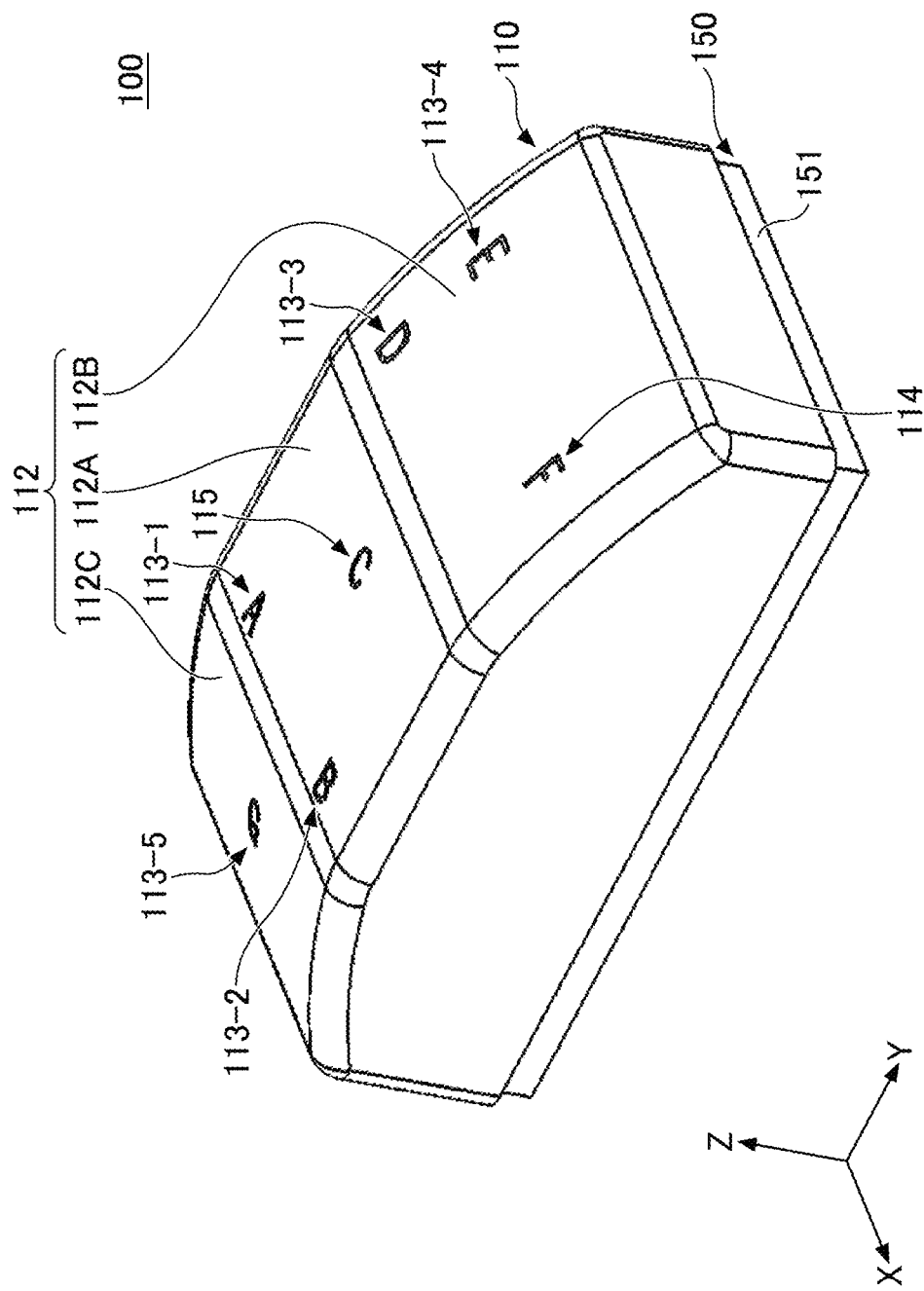
FIG. 1 is an external perspective view of an input device according to one embodiment of the present disclosure.
Figure 2:
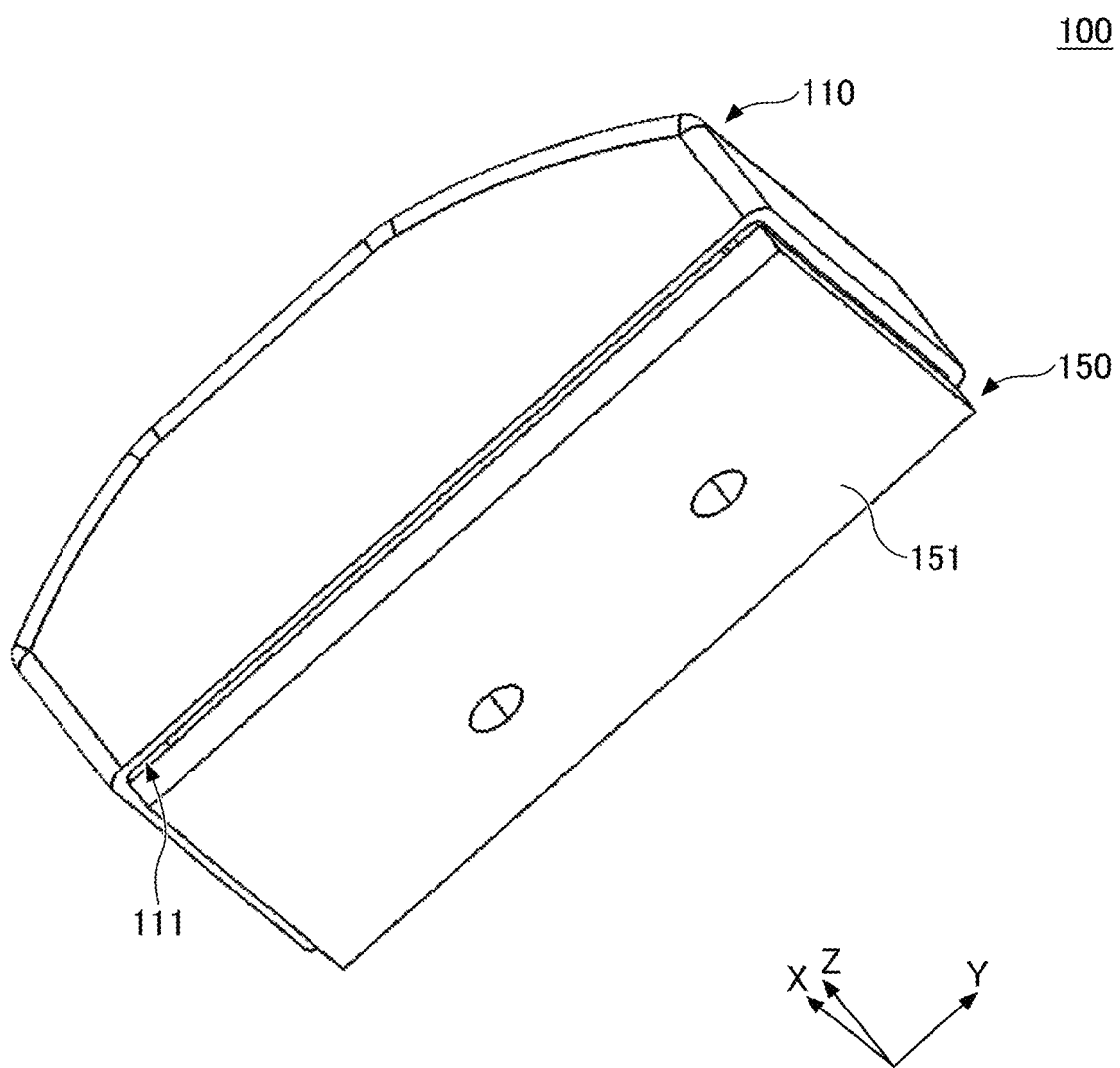
FIG. 2 is an external perspective view of the input device according to the embodiment.
Figure 3:
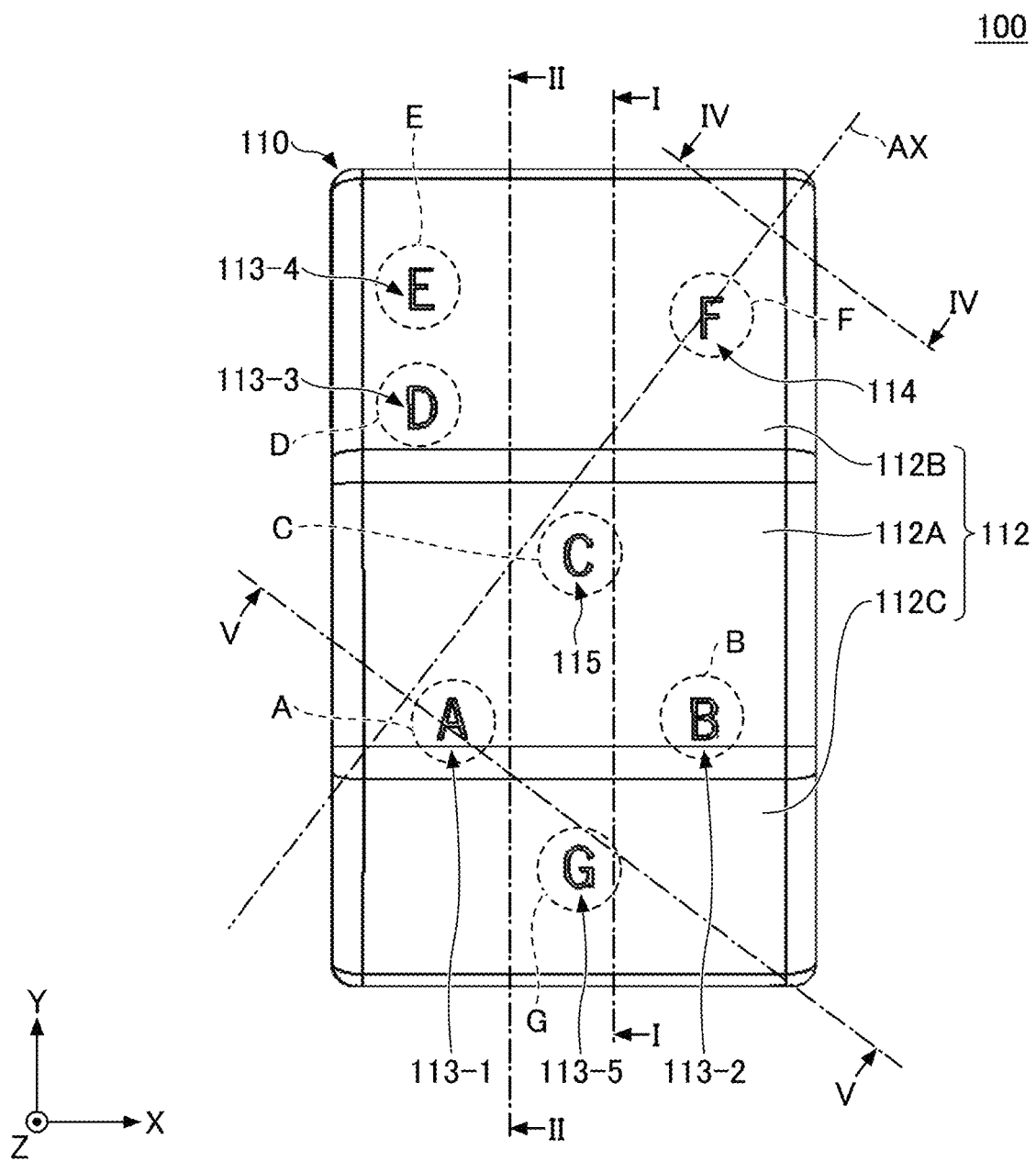
FIG. 3 is a plan view of the input device according to the embodiment.
Figure 4:
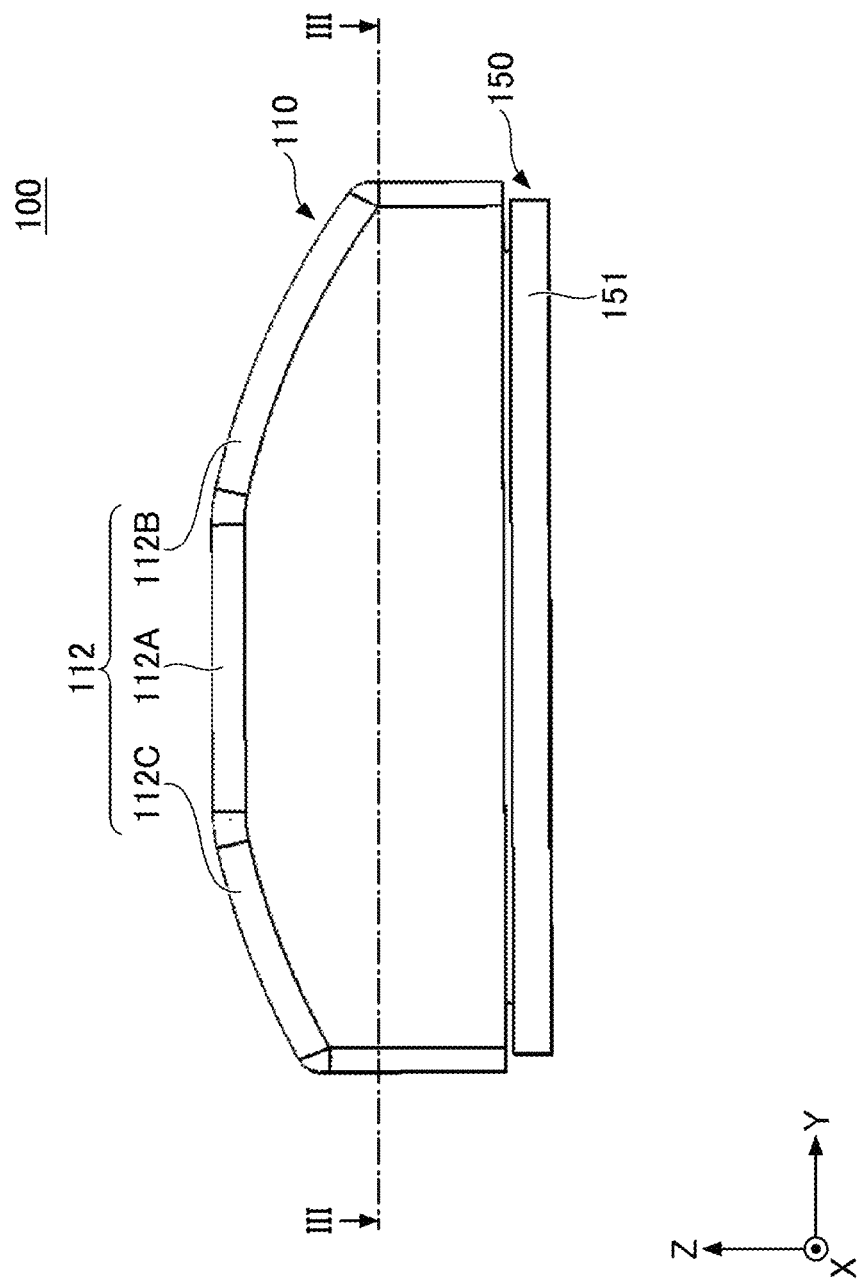
FIG. 4 is a side view of the input device according to the embodiment.
Figure 5:
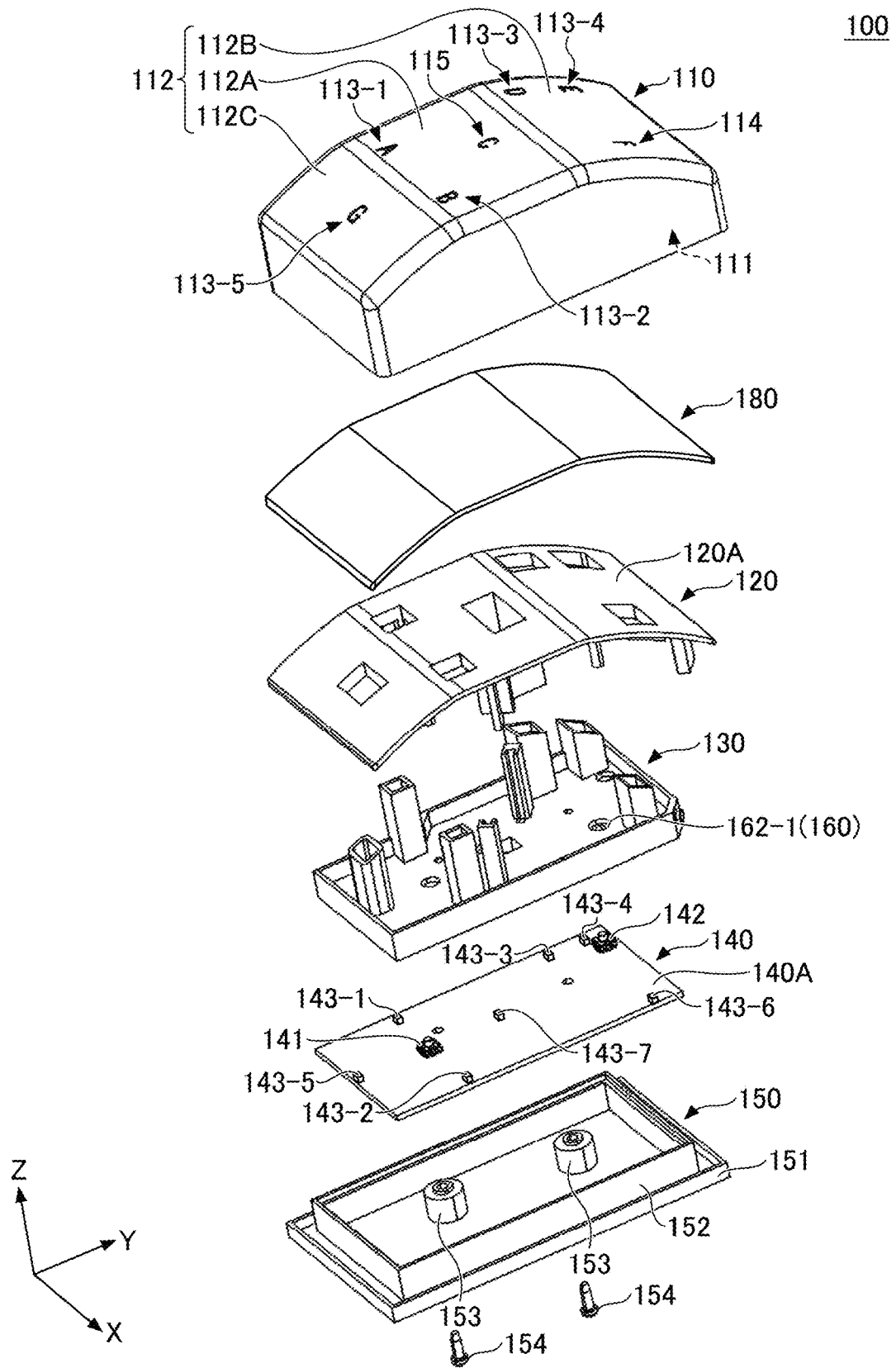
FIG. 5 is an exploded perspective view of the input device according to the embodiment.

FIGS. 1 and 2 are external perspective views of an input device 100 according to one embodiment. FIG. 3 is a plan view of the input device 100 according to the embodiment. FIG. 4 is a side view of the input device 100 according to the embodiment. FIG. 5 is an exploded perspective view of the input device 100 according to the embodiment.

In the following description, for the sake of convenience, an X-axis direction is defined as a left-right direction, a Y-axis direction is defined as a front-rear direction, and a Z-axis direction is defined as a vertical direction. However, a positive X-axis direction is defined as a right direction, a positive Y-axis direction is defined as a front direction, and a positive Z-axis direction is defined as an upward direction. These directions represent relative positional relationships within the device, and do not limit an installation direction or an operating direction of a device. All devices that have the same relative positional relationship within the device, and even those devices that have different installation directions or operating directions, are included in the scope of the present disclosure.

An input device 100 as illustrated in FIGS. 1 to 5 is, for example, a device that is mounted in a cabin of a vehicle such as an automobile and receives touching and pressing from an operator.

As illustrated in FIGS. 1 to 5, the input device 100 includes an operation panel 110, a holder 120, a first housing 130, a substrate 140, a second housing 150, and an electrostatic detection electrode sheet 180.

The operation panel 110 is a resin component that receives touching and pressing from an operator. In the present embodiment, the operation panel 110 is in a shape of a box having a hollow structure, and generally has a rectangular parallelepiped shape in which a lower surface includes a rectangular opening 111. In a plan view from the top, the operation panel 110 has a rectangular shape in which the front-rear direction (Y-axis direction) is a longitudinal direction. The operation panel 110 is rockably supported by the first housing 130. Specifically, the operation panel 110 is supported by the first housing 130 so as to be rockable about a rocking axis AX as illustrated in FIG. 3.

An upper surface 112 of the operation panel 110 includes a flat surface 112A, a first inclination 112B, and a second inclination 112C. The flat surface 112A is a central portion in the front-rear direction (Y-axis direction) and is a portion parallel to an XY plane. The first inclination 112B is a portion on the front side (Y-axis positive side) of the flat surface 112A and is a portion of an inclined surface inclined downward thereof. The second inclination 112C is a portion on the rear side (Y-axis negative side) of the flat surface 112A and is a portion of an inclined surface inclined downward thereof.

Areas A, B, C, D, E, F, and G are provided on the upper surface 112 of the operation panel 110. The areas A, B, D, E, and G receive both touching and pressing from an operator. The area F does not receive pressing from an operator, but only touching.

For example, the area A and the area B are arranged in a left-right direction (X-axis direction) on the rear side (Y-axis negative side) of the flat surface 112A. The area A is provided with a display portion 113-1 symbolizing the letter "A", and the area B is provided with a display portion 113-2 symbolizing the letter "B".

The area D and the area E are arranged in a front-rear direction (Y-axis direction) on the left side (X-axis negative side) of the first inclination 112B. The area E is an example of a "first operation portion" provided on the front side (Y-axis positive side) of the upper surface 112. The area D is provided with a display portion 113-3 symbolizing the letter "D", and the area E is provided with a display portion 113-4 symbolizing the letter "E".

The area F is provided on the right side (X-axis positive side) of the first inclination 112B. The area F is an example of the "second operation portion". The area F is provided with a display portion 114 symbolizing the letter "F".

The area G is provided in the center of the second inclination 112C. The area G is an example of the "first operation portion" provided on the rear side (Y-axis negative side) of the upper surface 112. The area G is provided with a display portion 113-5 symbolizing the letter "G".

The area C is provided in the center of the flat surface 112A. A display portion 115 symbolized by the letter "C" is provided in the area C. Note that the display portion 115 in the area C merely displays a display for enhancing design, and does not receive an operation from an operator.

The operation panel 110 is formed of white resin and a black coating layer, and the display portions A to G are formed by removing a part of the black coating layer using a technique such as laser processing. Through-holes are provided at portions corresponding to the display portions A to G of the holder 120, so that when light-emitting elements 143-1 to 143-7 emit light, light from the light-emitting elements 143-1 to 143-7 irradiates the back surfaces of the display portions A to G.

The holder 120 is a resin and plate-like component arranged and fixed inside the operation panel 110. An upper surface 120A of the holder 120 is bent along the upper surface 112 of the operation panel 110. The holder 120 is arranged inside the operation panel 110 so as to overlap with the back surface of the upper surface 112 of the operation panel 110. The holder 120 holds the electrostatic detection electrode sheet 180 on the upper surface 120A thereof. The electrostatic detection electrode sheet 180 includes a connection portion (not illustrated) connected to the substrate 140, and is electrically connected to the substrate 140. Thus, the input device 100 can detect touching performed on the area A to the area B, and the area D to the area G of the operation panel 110 by the electrostatic detection electrode sheet 180.

The holder 120 is fixed to the operation panel 110. The holder 120 is rockably supported by the first housing 130. Therefore, the holder 120 and the operation panel are rockable relative to the first housing 130. The holder 120 includes a pair of bearing holes 122A, a pair of guide ribs 171, a press portion 121-1, a press portion 121-2, and a projection 161-1, which will be described in detail in the following. The bearing hole 122A is shaped to be engaged with a lock portion 133 of the first housing 130, and is shaped to support the holder 120 and the operation panel in a rockable manner and to define a rocking range. The guide rib 171 is shaped to be engaged with a guide groove 172 of the first housing 130, and is shaped to define a rocking range between the holder 120 and the operation panel. The press portion 121-1 is shaped to press a first press switch 141. The press portion 121-2 is shaped to press a second press switch 142.

The first housing 130 is a resin component arranged below the holder 120 in the operation panel 110. The first housing 130 is provided so as to cover the substrate 140. The first housing 130 rockably supports the operation panel 110 and the holder 120. The first housing 130 is an example of a "housing". Since the first housing 130 is provided so as to cover the substrate 140, the projection 161-1 and a projection 161-2 provided on the holder 120 can contact the first housing 130. That is, the projections 161-1 and 161-2 can be prevented from contacting the substrate 140, so that damage to the substrate 140 caused by the projections 161-1 and 161-2 can be prevented.

The substrate 140 is a flat plate component made of resin. The substrate 140 has a rectangular shape having a front-rear direction as a longitudinal direction (Y-axis direction) in a plan view seen from the top. The substrate 140 is provided on the lower side (Z-axis negative side) of the first housing 130, and is arranged at a predetermined height inside a peripheral wall portion 152 of the second housing 150 in a posture parallel to the XY plane. A first press switch 141 and a second press switch 142 are mounted on an upper surface 140A of the substrate 140. The first press switch 141 and the second press switch 142 detect pressing relative to the operation panel 110 by an operator. The first press switch 141 is an example of a "pressure detector in which the distance to the first operation portion (area E) is longer among the two pressure detectors". The second press switch 142 is an example of a "pressure detector in which the distance to the first operation portion (area G) is longer among the two pressure detectors". The first press switch 141 is provided approximately in the center of a rear portion (a portion on the Y-axis negative side) of the upper surface 140A. The second press switch 142 is provided near a front-left corner (corner of the Y-axis positive side and the X-axis negative side) on the upper surface 140A. The light emitting elements 143-1 to 143-7 are mounted on the upper surface 140A of the substrate 140.

The second housing 150 is a resin component arranged at the lowermost portion of the input device 100. The second housing 150 includes a flat portion 151 and a peripheral wall portion 152. The flat portion 151 is a planar portion parallel to the XY plane. The peripheral wall portion 152 is provided so as to project upward (in the positive Z-axis direction) of the upper surface of the flat portion 151, and is a wall-shaped portion having a rectangular shape in a plan view seen from the top (in the positive Z-axis direction). In the second housing 150, two pedestal portions 153 are aligned in a front-rear direction on the upper surface of the flat portion 151, inside the peripheral wall portion 152. The pedestal portion 153 has a cylindrical shape and supports the substrate 140 at a predetermined height from the lower side (on the Z-axis negative side). The second housing 150 is screwed and fixed to the first housing 130 by two fixing screws 154 penetrating the pedestal portions 153 while being coupled to the lower side of the first housing 130.

In the input device 100 configured as described above, the holder 120 and the operation panel 110 rock around the rocking axis AX so that the rear-right corner (corner of the X-axis positive side and the Y-axis negative side) of the holder 120 and the operation panel 110 moves toward the substrate 140 when any one of the areas A, B, or G of the operation panel 110 is pressed. Thus, the input device 100 can detect that when the first press switch 141 is pressed, any one of the areas A, B, or G is pressed.

Further, in the input device 100, the holder 120 and the operation panel 110 rock around the rocking axis AX so that the front-left corner (the corner of the X-axis negative side and the Y-axis positive side) of the holder 120 and the operation panel 110 moves toward the substrate 140 when either of the areas D or E of the operation panel 110 is pressed. Thus, the input device 100 can detect that either of the areas D or E is pressed when the second press switch 142 is pressed.

Further, the input device 100 includes a restrainer 160 described in the following, so that when the area F of the operation panel 110 is pressed, the rocking of the holder 120 and the operation panel 110 is restrained, and the first press switch 141 and the second press switch 142 are not pressed.

Further, the input device 100 includes a restrainer 160 described in the following, so that when the symbol display portion 115 of the operation panel 110 is pressed, the rocking of the holder 120 and the operation panel 110 is restrained, and the first press switch 141 and the second press switch 142 are not pressed.

Therefore, when a misoperation is performed, the input device 100 can avoid detection of the misoperation.

As illustrated in FIG. 3, the area F is provided on the rocking axis AX. This makes it difficult for the input device 100 to rock the operation panel 110 and the holder 120 when a misoperation of pressing the area F is performed. Accordingly, it is possible to prevent the first press switch 141 and the second press switch 142 from being pressed by misoperation.

Configuration of the First Housing 130

Figure 6:
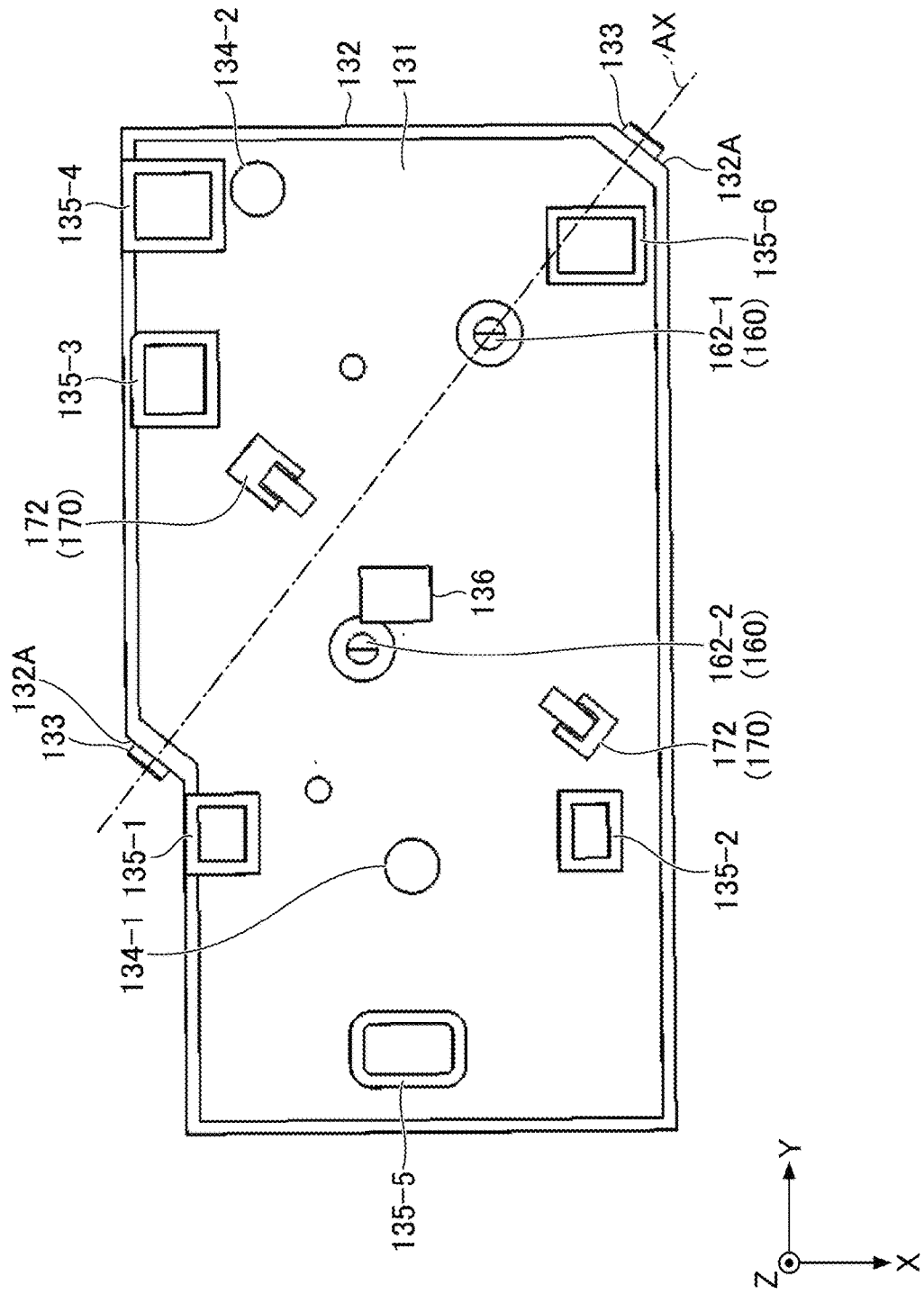
FIG. 6 is a top view of a case included in the input device according to the embodiment.
Figure 7:
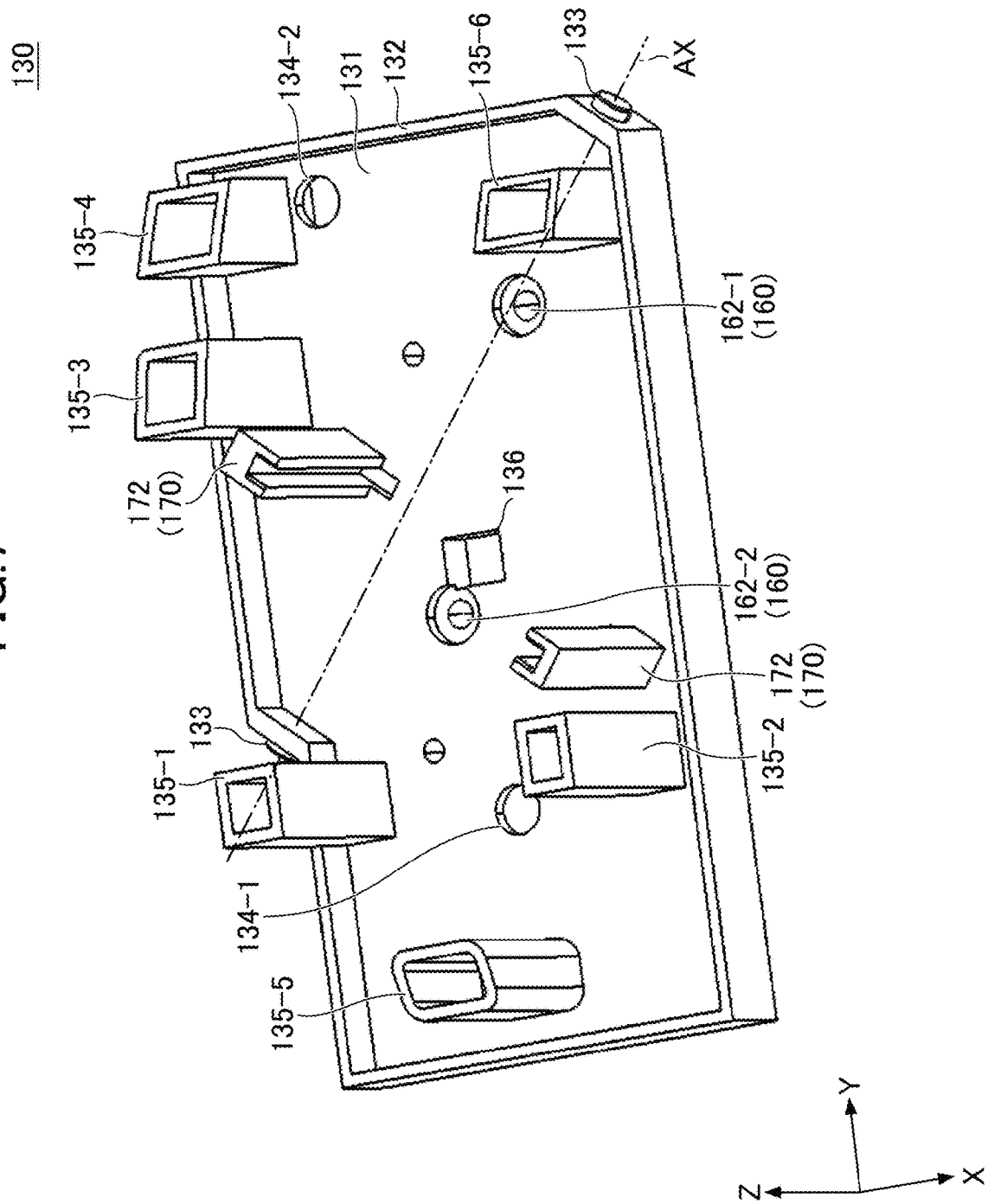
FIG. 7 is an external perspective view of the case included in the input device according to the embodiment.

FIG. 6 is a plan view of the first housing 130 provided in the input device 100 according to the embodiment. FIG. 7 is an external perspective view of the first housing 130 provided in the input device 100 according to the embodiment.

As illustrated in FIGS. 6 and 7, the first housing 130 includes a flat portion 131 parallel to the XY plane, and a wall-shaped frame 132 that is perpendicular to the XY plane and surrounding the flat portion 131. The first housing 130 also includes a pair of cylindrical lock portions 133 protruding in a direction of the rocking axis AX, on side surfaces of the frame 132.

Specifically, in the first housing 130, a pair of support surfaces 132A orthogonal to the rocking axis AX are formed at a side surface of the front-right corner (corner of the X-axis positive side and the Y-axis positive side) of the frame 132 and at an intermediate position in the front-rear direction (Y-axis direction) of the left side surface (side surface on the X-axis negative side) of the frame 132. In the first housing 130, the pair of cylindrical lock portions 133 projecting in the direction of the rocking axis AX are respectively provided on the pair of support surfaces 132A. The pair of lock portions 133 have a cylindrical shape, are formed at edges of the first housing 130, and are shaped to form the rocking axis AX.

When the pair of lock portions 133 are fitted into the pair of bearing holes 122A provided in the holder 120, the holder 120 and the operation panel 110 are rockably engaged around the rocking axis AX. Since the pair of lock portions 133 rock around the rocking axis AX while contacting surfaces 122Ac and 122Ad, which will be described in detail in the following, the holder 120 and the operation panel 110 are held rockably in the direction (rocking direction) with the rocking axis AX as the rocking center.

At the same time, each of the lock portions 133 respectively contacts the surfaces 122Ac and 122Ad, thereby restricting the holder 120 and the operation panel 110 from rotating in a rotation direction in which the Z-axis direction is a center axis. Further, the respective lock portions 133 can move upward (in the positive Z-axis direction) until they contact a surface 122Aa, which will be described in detail in the following. Therefore, when there is no element other than the surface 122Aa to prevent the shift, the lock portions 133 can move downward thereof (in the negative Z-axis direction) until they contact a surface 122Ab.

Figure 17:
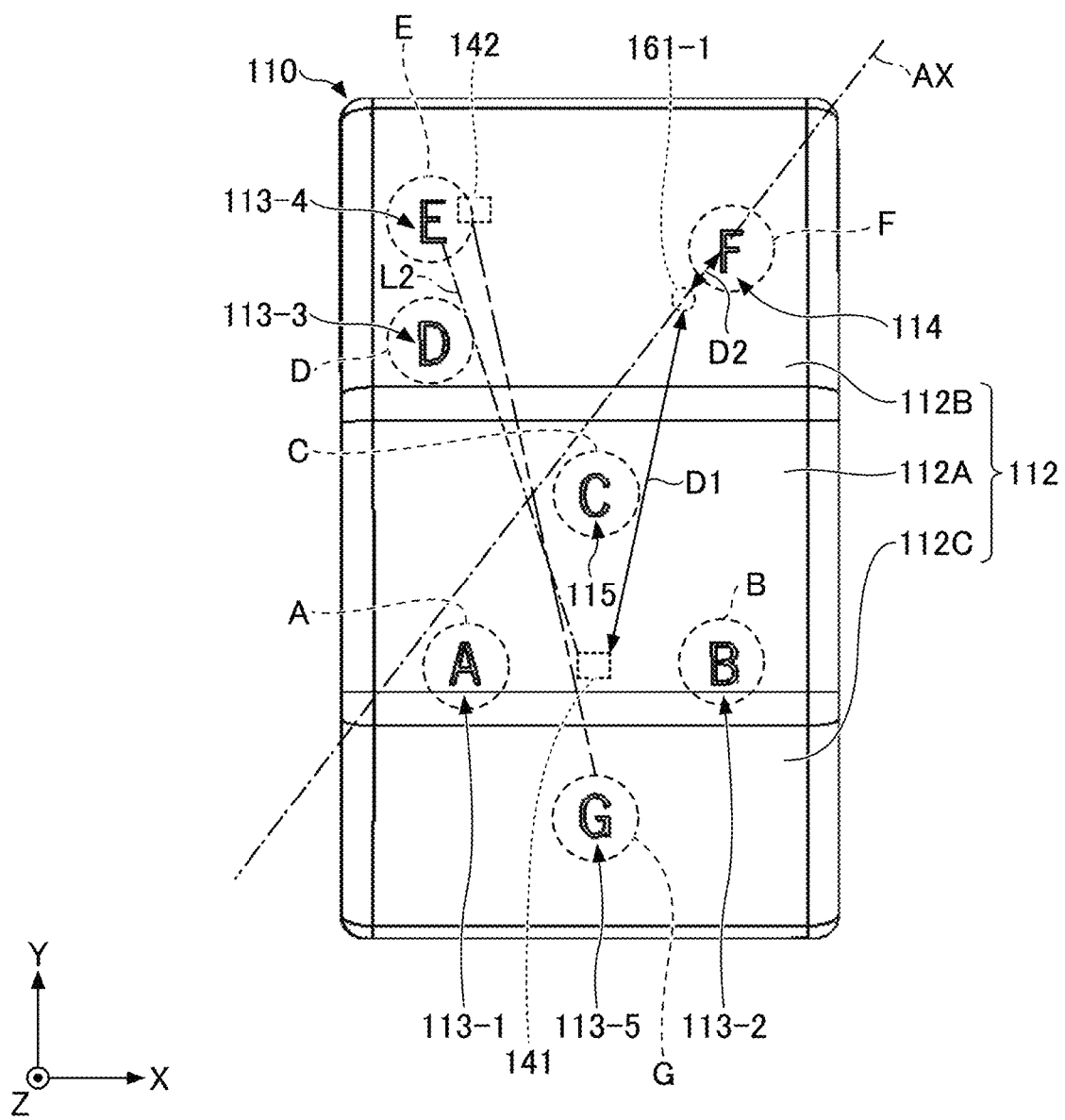
FIG. 17 is a diagram illustrating a positional relationship between a rocking axis, an area E, an area G, an area F, a first press switch and a second press switch, and a projection, in the input device according to the embodiment.

Further, the holder 120 and the operation panel 110 are supported by the two press switches (141 and 142) while their vertical movement limit positions are defined by the surface 122Aa and the surface 122Ab, and are caused to move upward thereof by a recovery force from the two press switches. In other words, the holder 120 and the operation panel 110 are restricted so as not to rotate only in the rotation direction in which with the Z-axis direction is the center axis, and at the same time, they are configured to be rockable in all other directions. As illustrated in FIG. 17, in the present embodiment, since the projection 161-1 is provided in the vicinity of the area F, the projection 161-1 prevents the lock portion 133 provided in the vicinity of the area F from shifting downward thereof. Therefore, when the area F is pressed, the holder 120 and the operation panel 110 do not rock.

Further, as illustrated in FIGS. 6 and 7, two through-holes 134-1 and 134-2 having a circular shape in a plan view seen from the top are formed in the flat portion 131 of the first housing 130.

The through-hole 134-1 is formed, in a plan view seen from the top, at a position overlapping with the press portion 121-1 provided in the holder 120 and with the first press switch 141 mounted on the substrate 140. The through-hole 134-1 enables the holder 120 and the operation panel 110 to rock (rocking in which the rear-right corner moves toward the substrate 140) when any one of the areas A, B, or G of the operation panel 110 is pressed by penetration of the press portion 121-1 therethrough, and enables the press portion 121-1 to press the first press switch 141 by the rocking of the holder 120 and the operation panel 110.

The through-hole 134-2 is formed, in a plan view seen from the top, at a position overlapping with the press portion 121-2 provided in the holder 120 and with the second press switch 142 mounted on the substrate 140. The through-hole 134-2 enables the holder 120 and the operation panel 110 to rock (rocking in which the front-left corner moves toward the substrate 140) when either of the area D or the area E of the operation panel 110 is pressed by penetration of the press portion 121-2 therethrough, and enables the press portion 121-2 to press the second press switch 142 by the rocking of the holder 120 and the operation panel 110.

As illustrated in FIGS. 6 and 7, the flat portion 131 of the first housing 130 includes two recessed contact portions 162-1 and 162-2 having a circular shape in a plan view seen from the top.

The contact portion 162-1 is included in the restrainer 160 and is formed, in a plan view seen from the top, at a position overlapping with an area on the front-right side (an area on the X-axis positive side and an area on the Y-axis positive side) of the flat portion 131 and with the projection 161-1 provided in the holder 120. The contact portion 162-1 prevents the holder 120 and the operation panel 110 from rocking by contacting the projection 161-1 when the area F of the operation panel 110 is pressed, and prevents the first press switch 141 and the second press switch 142 from being pressed.

The contact portion 162-2 is formed, in a plan view seen from the top, at a position overlapping with the projection 161-2 provided in the holder 120, approximately in a center of the flat portion 131. When the symbol display portion 115 of the operation panel 110 is pressed, the contact portion 162-2 prevents the holder 120 and the operation panel 110 from rocking by contacting the projection 161-2, and prevents the first press switch 141 and the second press switch 142 from being pressed.

As illustrated in FIGS. 6 and 7, the flat portion 131 of the first housing 130 is provided with tubular portions 135-1 to 135-6 having a rectangular cylindrical shape and a rectangular opening 136.

The tubular portion 135-1 is provided, in a plan view seen from the top, at a position overlapping with the area A of the operation panel 110 and with the light-emitting element 143-1 mounted on the substrate 140, and directs light emitted from the light-emitting element 143-1 to the area A to cause the display portion 113-1 in the area A to light up.

The tubular portion 135-2 is provided, in a plan view seen from the top, at a position overlapping with the area B of the operation panel 110 and with the light-emitting element 143-2 mounted on the substrate 140, and directs light emitted from the light-emitting element 143-2 to the area B to cause the display portion 113-2 in the area B to light up.

The tubular portion 135-3 is provided, in a plan view seen from the top, at a position overlapping with the area D of the operation panel 110 and with the light-emitting element 143-3 mounted on the substrate 140, and directs light emitted from the light-emitting element 143-3 to the area D to cause the display portion 113-3 in the area D to light up.

The tubular portion 135-4 is provided, in a plan view seen from the top, at a position overlapping with the area E of the operation panel 110 and with the light-emitting element 143-4 mounted on the substrate 140, and directs light emitted from the light-emitting element 143-4 to the area E to cause the display portion 113-4 in the area E to light up.

The tubular portion 135-5 is provided, in a plan view seen from the top, at a position overlapping with the area G of the operation panel 110 and with the light-emitting element 143-5 mounted on the substrate 140, and directs light emitted from the light-emitting element 143-5 to the area G to cause the display portion 113-5 in the area G to light up.

The tubular portion 135-6 is provided, in a plan view seen from the top, at a position overlapping with the area F of the operation panel 110 and with the light-emitting element 143-6 mounted on the substrate 140, and directs light emitted from the light-emitting element 143-6 to the area F to cause the display portion 114 in the area F to light up.

The opening 136 is provided, in a plan view seen from the top, at a position overlapping with the symbol display portion 115 of the operation panel 110, a tubular portion 123 of the holder 120, and the light-emitting element 143-7 mounted on the substrate 140, and directs light emitted from the light-emitting element 143-7 to the symbol display portion 115 via the tubular portion 123 of the holder 120 to cause the symbol display portion 115 to light up.

An amount by which the tubular portions 135-1 to 135-6 can move in the vertical direction (Z-axis direction) when the operation panel 110 rocks is equal to or greater than an amount by which the press portions 121-1 and 121-2 can move in the vertical direction (Z-axis direction) when the operation panel 110 rocks. Thus, in the input device 100, the movement of the tubular portions 135-1 to 135-6 in the vertical direction (Z-axis direction) when the operation panel 110 rocks does not interfere with the pressing on the first press switch 141 and the second press switch 142 by the press portions 121-1 and 121-2.

Configuration of the Holder 120

Figure 8:
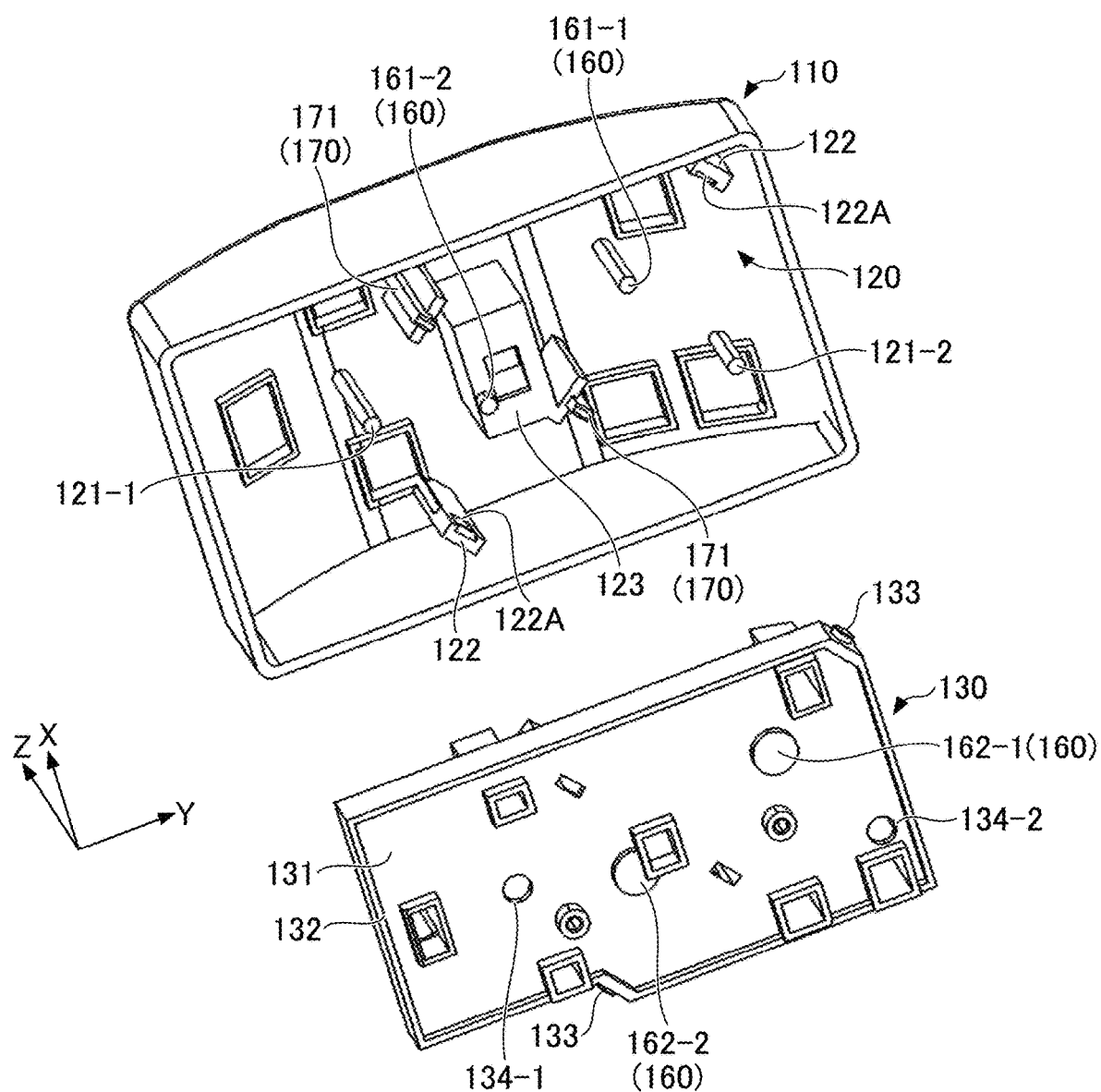
FIG. 8 is an external perspective view of an operation panel, a holder, and a first housing included in the input device according to the embodiment.
Figure 9:
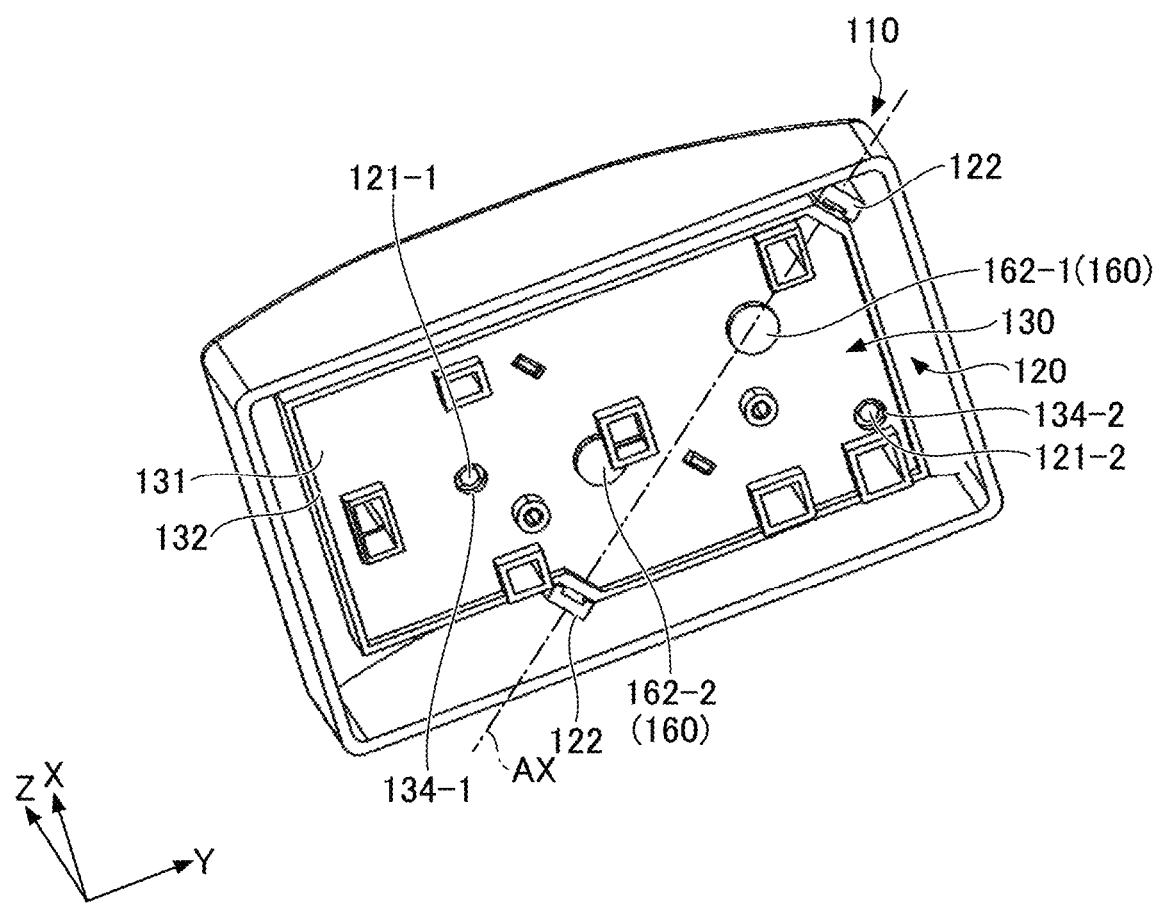
FIG. 9 is an external perspective view of the operation panel, the holder, and the first housing included in the input device according to the embodiment.
Figure 10:
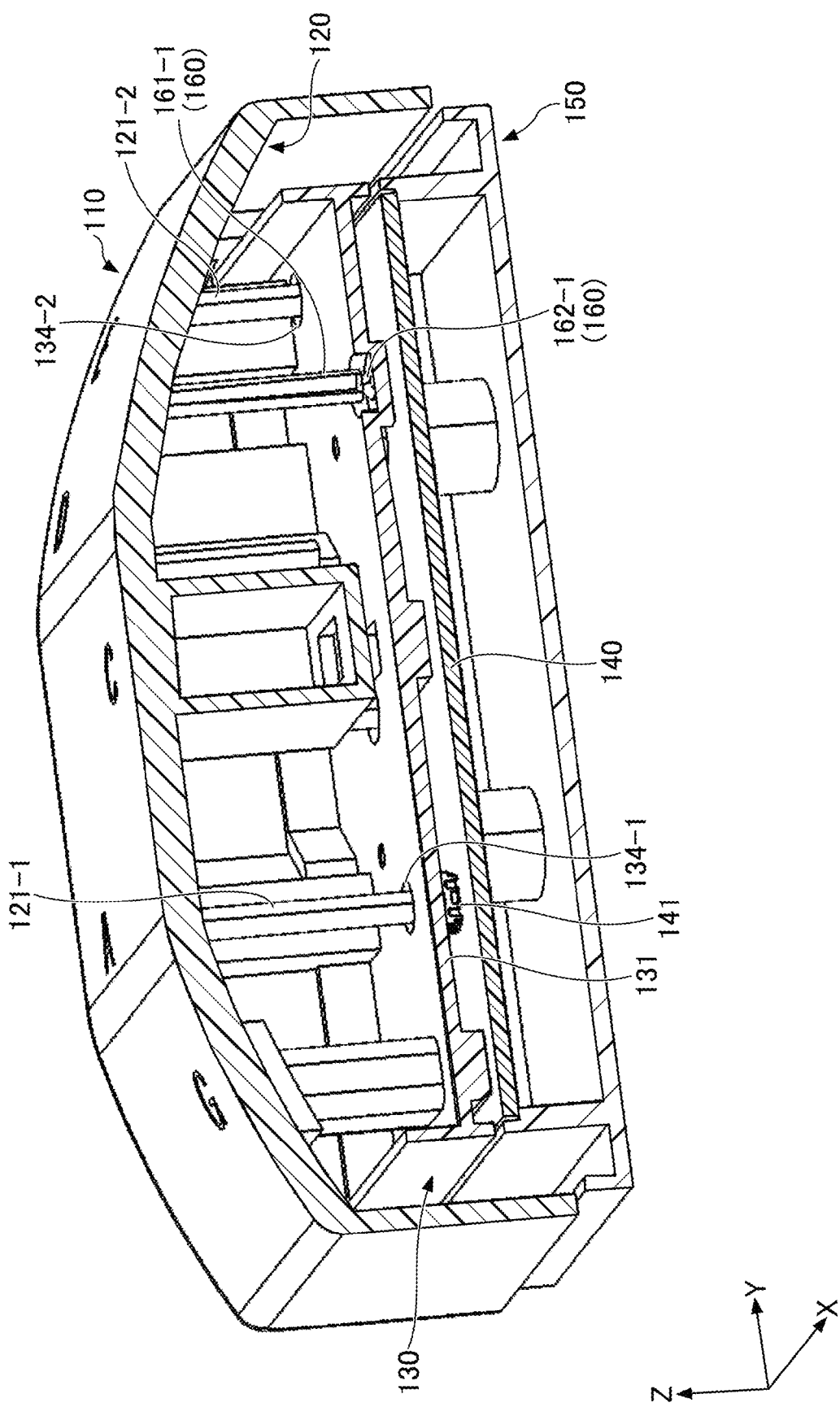
FIG. 10 is a cross-sectional perspective view of the input device according to the embodiment taken along the line I-I.
Figure 11:
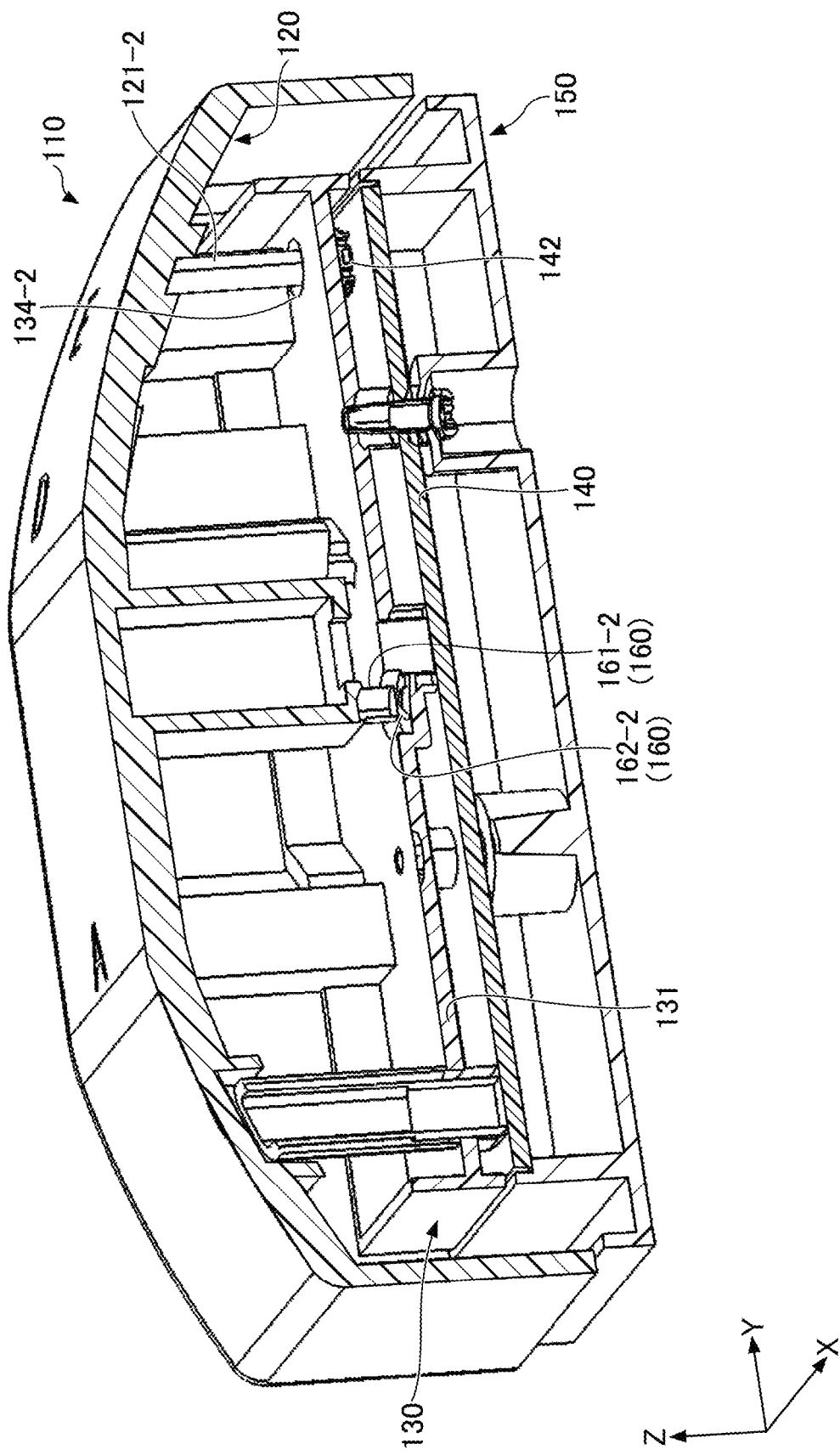
FIG. 11 is a cross-sectional perspective view of the input device according to the embodiment taken along the line II-II.

FIGS. 8 and 9 are external perspective views of the operation panel 110, the holder 120, and the first housing 130 provided in the input device 100 according to the embodiment. FIG. 10 is a sectional perspective view taken along a section line I-I (see FIG. 3) of the input device 100 according to the embodiment. FIG. 11 is a sectional perspective view taken along a section line II-II (see FIG. 3) of the input device 100 according to the embodiment.

As illustrated in FIG. 8, the first housing 130 includes a pair of lock portions 133. On the other hand, the holder 120 includes a pair of bearing portions 122 provided so as to hang down from a lower surface of the holder 120. Each of the pair of bearing portions 122 includes the bearing hole 122A in a vicinity of the lower end. As illustrated in FIG. 9, when the first housing 130 is assembled to the holder 120, each of the pair of lock portions 133 is fitted into a corresponding bearing hole 122A of the pair of bearing holes 122A.

Figure 14:
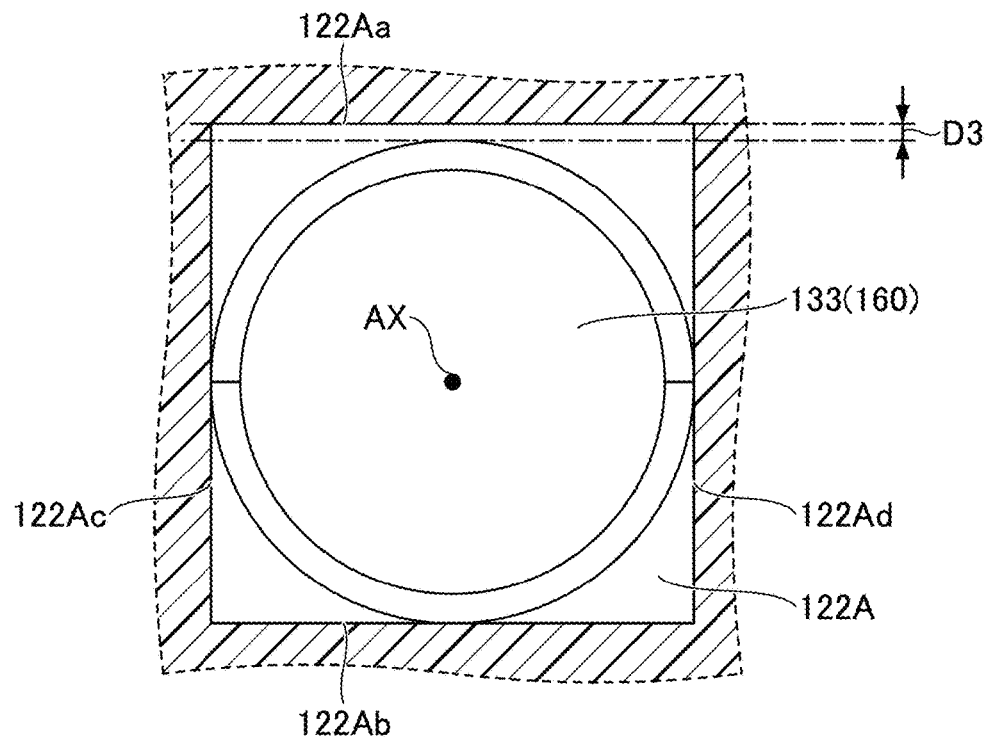
FIG. 14 is an enlarged view of a portion (a portion P1) of FIG. 13.
Figure 15:
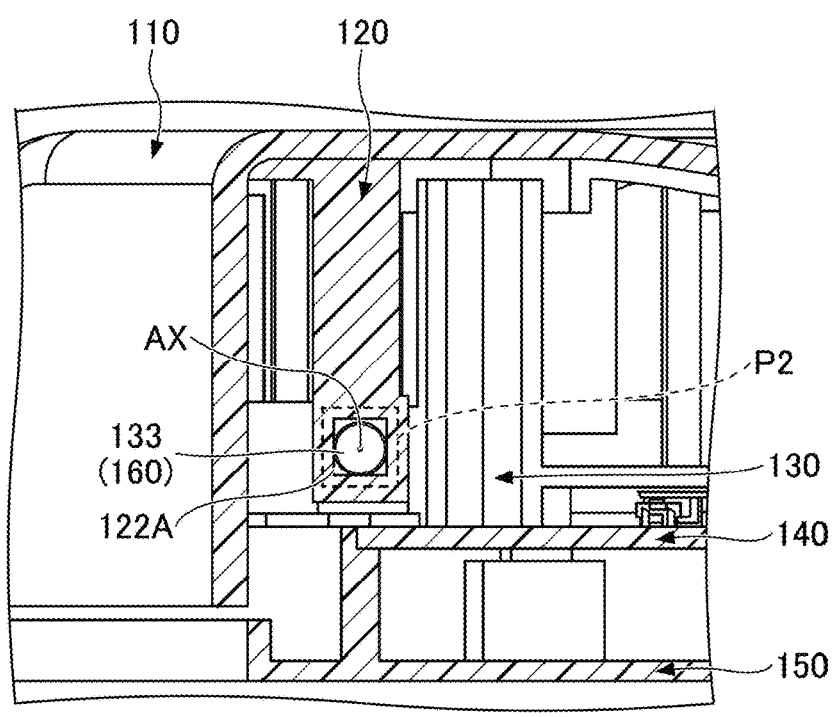
FIG. 15 is a cross-sectional perspective view of the input device according to the embodiment taken along the line V-V.
Figure 16:
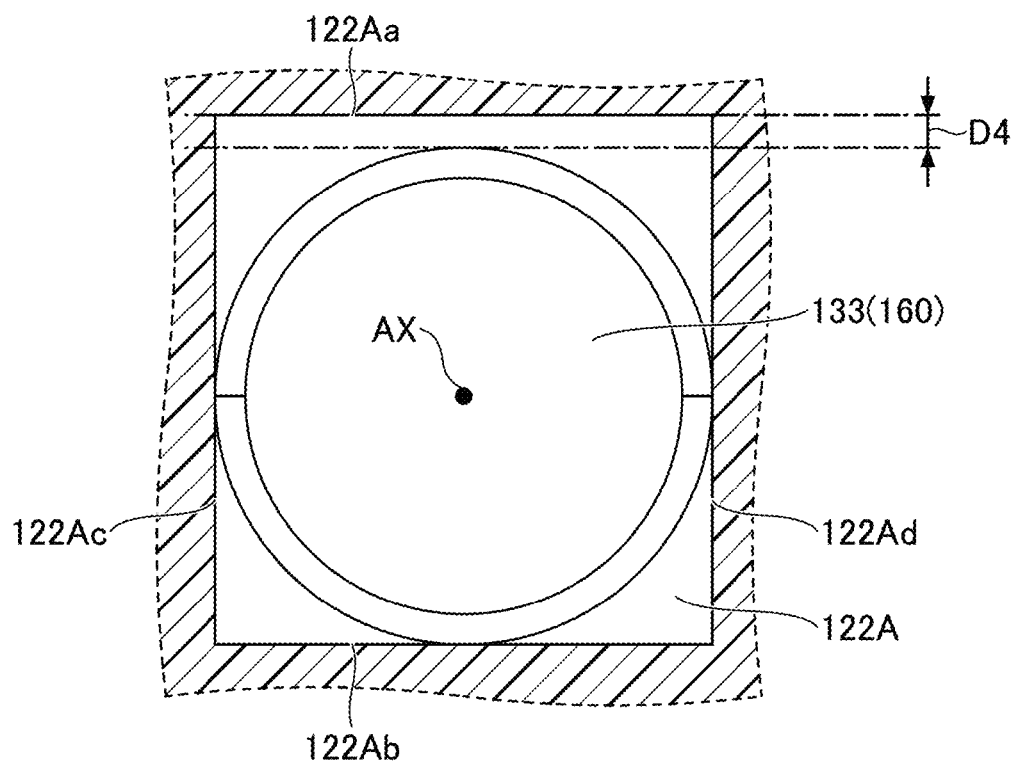
FIG. 16 is an enlarged view of a portion (a portion P2) of FIG. 15.

The holder 120 is supported in a state of being caused to move upward thereof (in the positive Z-axis direction) by the recovery force of the first press switch 141 and the second press switch 142. As illustrated in FIGS. 14 and 16, the bearing hole 122A of the holder 120 includes surfaces 122Aa to 122Ad, and has a vertically elongated rectangular shape.

The surface 122Aa and the surface 122Ab face each other. The surface 122Aa defines a limit position when the holder 120 shifts downward thereof. The surface 122Ab defines a limit position when the holder 120 shifts upward thereof. The surface 122Ac and the surface 122Ad face each other, and a distance therebetween is approximately the same as the size of the lock portion 133.

When the first housing 130 is assembled to the holder 120, the holder 120 is caused to move upward thereof by the first press switch 141 and the second press switch 142, so that the surface 122Ab of the holder 120 and the lock portion 133 of the first housing 130 contact each other. For the same reason, the surface 122Aa and the lock portion 133 are positioned apart from each other by a distance D3 or a distance D4. As a result, the holder 120 and the operation panel 110 do not rotate around the Z-axis direction because movement of the lock portion 133 is restricted by the surface 122Ac and the surface 122Ad, and at the same time, are arranged to be rockable in all other directions.

In other words, the holder 120 and the operation panel 110 are supported by the pair of lock portions 133 so as to be rockable around the rocking axis AX, and are supported so as to be vertically movable by the distance D3 and the distance D4. For this reason, the holder 120 and the operation panel 110 can rock around the rocking axis AX in a range up to they are stopped by receiving a reaction force from the first press switch 141 or the second press switch 142. In the present embodiment, the distance D3 and the distance D4 are set approximately the same as an operation stroke of when the two press switches (141 and 142) are pressed and turned on from a neutral state.

The holder 120 and the operation panel 110 can rock in a direction parallel to the rocking axis AX and a plane parallel to the vertical direction (Z-axis direction) in a range until the lock portions 133 are restricted by the surface 122Aa or the surface 122Ab.

The range in which the holder 120 and the operation panel 110 rock in the direction parallel to the rocking axis AX and the plane parallel to the vertical direction (Z-axis direction) is preferably set smaller than the switch stroke of when the second press switch 142 is pressed and turned on from the neutral state.

The range in which the holder 120 and the operation panel 110 rock in the direction parallel to the rocking axis AX and the plane parallel to the vertical direction (Z-axis direction) is set smaller than the range in which the holder 120 and the operation panel 110 rock around the rocking axis AX.

Further, as illustrated in FIG. 8, the holder 120 is provided with the cylindrical projections 161-1 and 161-2 that extend downward of the lower surface of the holder 120.

Specifically, the projection 161-1 is included in the restrainer 160 and is provided in an area on the front-right side of the holder 120 (an area on the X-axis positive side and the Y-axis positive side) and at a position overlapping with the contact portion 162-1 of the first housing 130, in a plan view seen from the top. As illustrated in FIGS. 6 and 7, in a plan view seen from the top, the contact portion 162-1 is provided at a position overlapping with the rocking axis AX and at a position closer to the area F than the center of the pair of lock portions 133. As illustrated in FIGS. 9 and 10, when the first housing 130 is assembled to the holder 120, the lower end surface of the projection 161-1 is positioned slightly apart from the upper side of the contact portion 162-1 of the first housing 130. Thus, when the area F of the operation panel 110 is pressed, the projection 161-1 contacts the contact portion 162-1, thereby restraining rocking of the holder 120 and the operation panel 110 and preventing the second press switch 142 from being pressed. As described above, the range in which the holder 120 and the operation panel 110 rock in the direction parallel to the rocking axis AX and the plane parallel to the vertical direction (Z-axis direction) is set smaller than ranges in which the holder 120 and the operation panel 110 rock in other directions, and under such conditions, the above-described restraining effect is generated. Therefore, when the area F of the operation panel 110 is pressed, the holder 120 and the operation panel 110 do not appreciably shift. Further, a touch feeling generated by the contact between the projection 161-1 and the contact portion 162-1 is fed back to a finger of an operator as a clear resistance. Therefore, the operator can sense from the operation touch feeling that the area F is an operation portion that does not correspond to the pressing. When the area E or the area G is pressed, the projection 161-1 does not contact the contact portion 162-1, so that the rocking of the holder 120 and the operation panel 110 is not restrained.

The projection 161-2 is included in the restrainer 160. The projection 161-2 is provided approximately in the center of the holder 120 and, in a plan view from the top, at a position overlapping with the contact portion 162-2 of the first housing 130. As illustrated in FIGS. 9 and 11, when the first housing 130 is assembled to the holder 120, the lower end surface of the projection 161-2 is positioned slightly apart from the upper side of the contact portion 162-2 of the first housing 130. Thus, when the symbol display portion 115 of the operation panel 110 is pressed, the projection 161-2 contacts the contact portion 162-2 to restrain rocking of the holder 120 and the operation panel 110, thereby preventing the first press switch 141 and the second press switch 142 from being pressed. Incidentally, when the area E is pressed, the projection 161-2 does not contact the contact portion 162-2, so that the rocking of the holder 120 and the operation panel 110 is not restrained.

Further, as illustrated in FIG. 8, the holder 120 is provided with cylindrical press portions 121-1 and 121-2 that extend downward of the lower surface of the holder 120.

More specifically, the press portion 121-1 is provided approximately in the center in the left-right direction (X-axis direction) of the area on the rear side (Y-axis negative side) of the holder 120, and at a position overlapping with the through-hole 134-1 of the first housing 130, in a plan view seen from the top. As illustrated in FIG. 9, when the first housing 130 is assembled to the holder 120, the lower end surface of the press portion 121-1 is positioned slightly apart from the upper side of the first press switch 141 in a state penetrating through the through-hole 134-1. Thus, when any one of the areas A, B, or G of the operation panel 110 is pressed, the press portion 121-1 can press the first press switch 141 by rocking of the holder 120 and the operation panel 110.

Furthermore, the press portion 121-2 is provided near the front-left corner (corner of the X-axis negative side and the Y-axis positive side) of the holder 120, and at a position overlapping with the through-hole 134-2 of the first housing 130, in a plan view seen from the top. As illustrated in FIG. 9, when the first housing 130 is assembled to the holder 120, the lower end surface of the press portion 121-2 is positioned slightly apart from the upper side of the second press switch 142 in a state penetrating through the through-hole 134-2. Thus, when either of the areas D or E of the operation panel 110 is pressed, the press portion 121-2 can press the second press switch 142 by rocking of the holder 120 and the operation panel 110.

Guide

Figure 12:
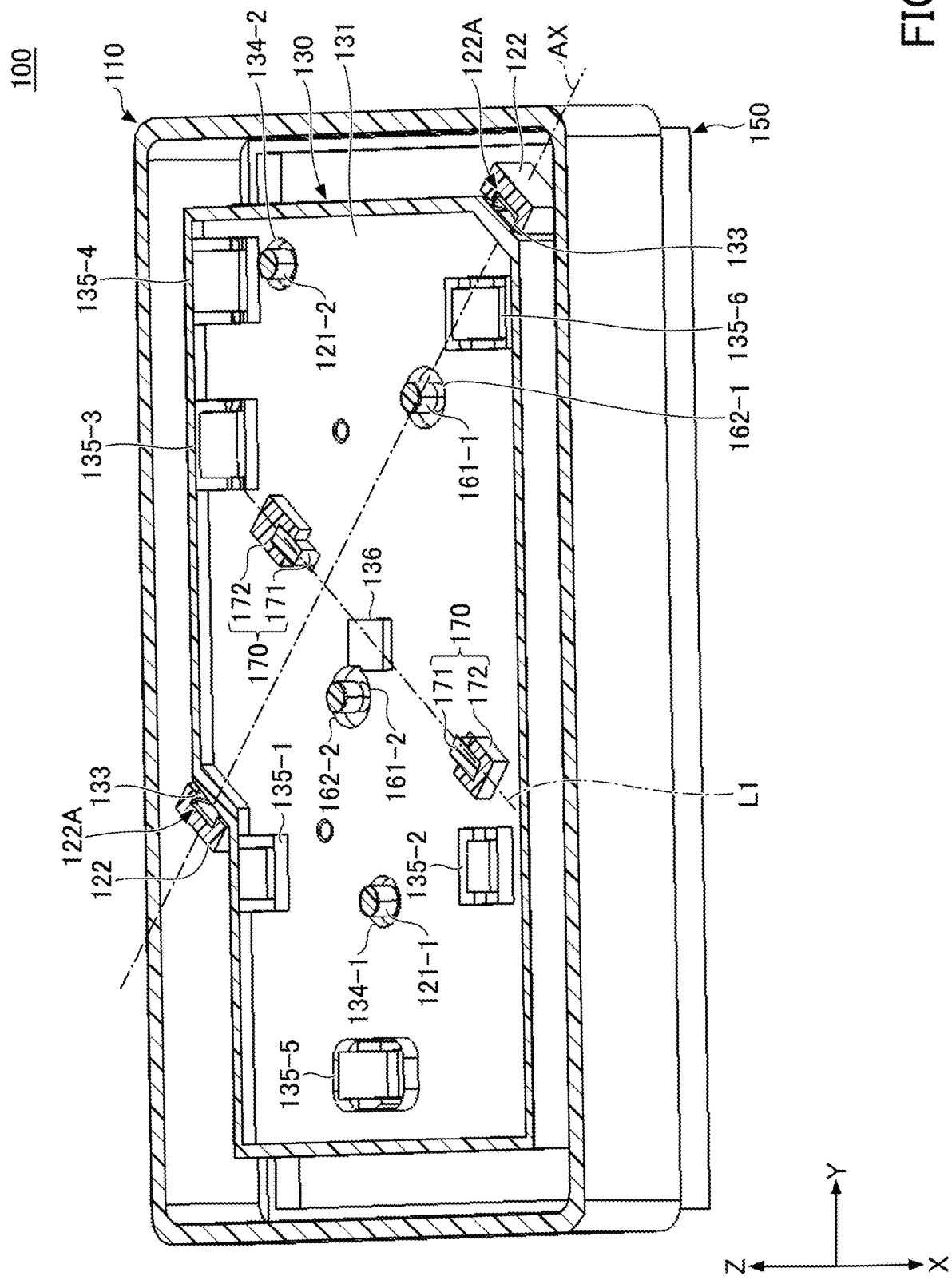
FIG. 12 is a cross-sectional perspective view of the input device according to the embodiment taken along the line III-III.

FIG. 12 is a sectional perspective view of the input device 100 according to the embodiment taken along a section line III-III (see FIG. 4).

The input device 100 according to the embodiment includes a guide 170. The guide 170 includes a pair of guide ribs 171 provided so as to extend downward of the lower surface of the holder 120, and a pair of guide grooves 172 vertically projecting from the lower surface of the holder 120. As illustrated in FIG. 12, the guide 170 guides the movement of the holder 120 and the operation panel 110 in the vertical direction (X-axis direction) by engaging the pair of guide ribs 171 with the pair of guide grooves 172.

As illustrated in FIG. 12, a line L1 connecting the pair of guide ribs 171 is approximately orthogonal to the rocking axis AX. Thus, the input device 100 according to the embodiment can guide rocking of the holder 120 and the operation panel 110 around the rocking axis AX, and can lock the tilt of the rocking axis AX of the holder 120 and the operation panel 110 in the axial direction.

Configuration of the Bearing Holes 122A

Figure 13:
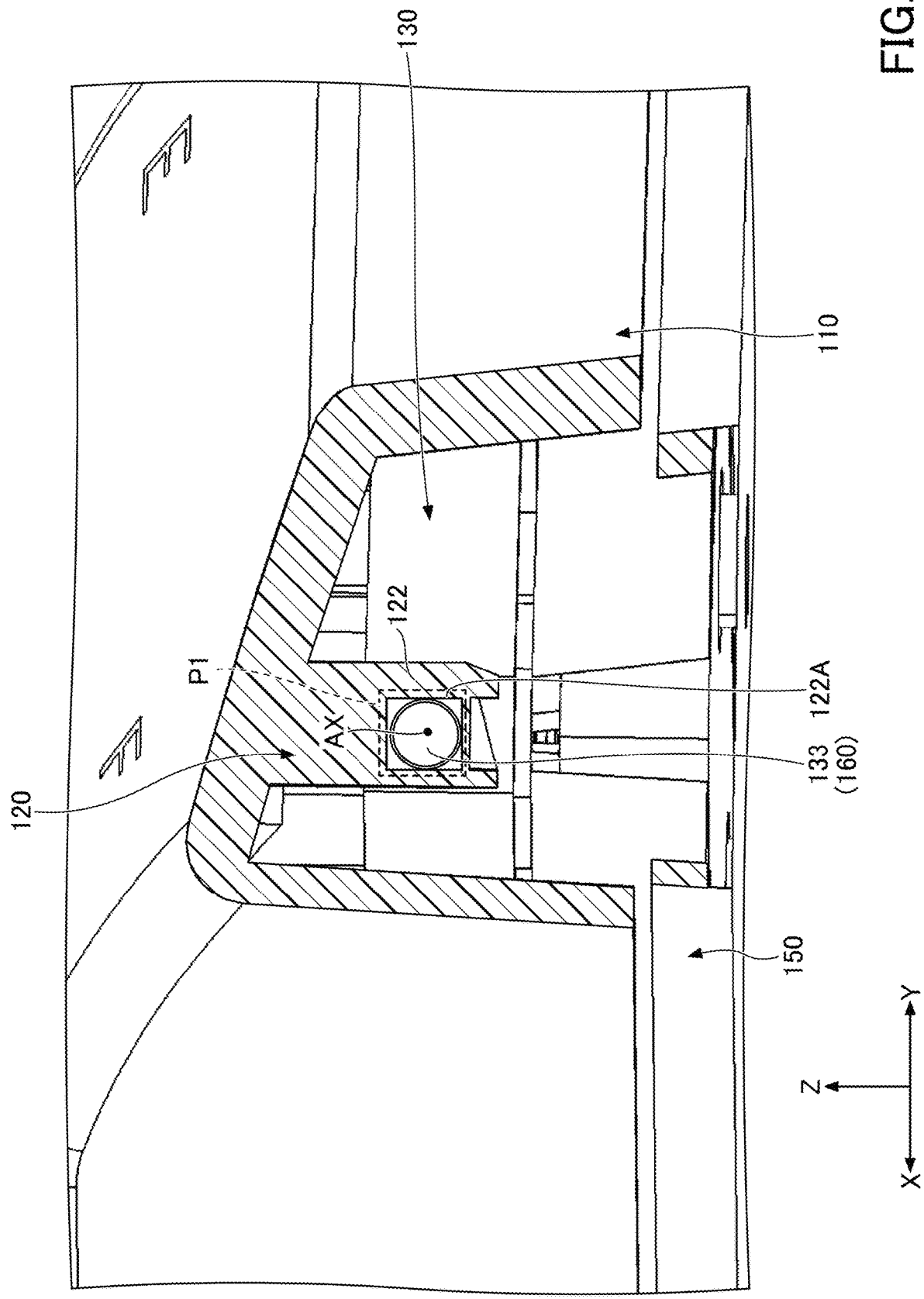
FIG. 13 is a cross-sectional perspective view of the input device according to the embodiment taken along the line IV-IV.

FIG. 13 is a sectional perspective view of an input device 100 according to the embodiment taken along a sectional line IV-IV (see FIG. 3). As illustrated in FIG. 13, the lock portion 133 of the first housing 130 is fitted into the bearing hole 122A of the holder 120, thereby locking the holder 120 and the operation panel 110 so as to be rockable about the rocking axis AX. The lock portion 133 is included in the restrainer 160.

Here, as illustrated in FIG. 13, the lateral width of the bearing hole 122A is approximately the diameter of the lock portion 133, but a vertical width thereof is slightly larger than the diameter of the lock portion 133. Therefore, the bearing hole 122A can move slightly in the vertical direction (Z-axis direction) within the bearing hole 122A. Thus, the input device 100 according to the embodiment can move slightly in the vertical direction (Z-axis direction) to such an extent that the holder 120 and the operation panel 110 do not press the first press switch 141 and the second press switch 142 relative to the first housing 130.

FIG. 17 is a diagram illustrating a positional relationship between the rocking axis AX, the area E, the area G, the area F, the first press switch 141 and the second press switch 142, and the projection 161-1 in the input device 100 according to the embodiment.

In the input device 100 according to the embodiment, the rocking axis AX connecting the two lock portions 133 intersects with a line connecting the area E and the first press switch 141 in a plan view seen from the top. The rocking axis AX also intersects with a line connecting the area G and the second press switch 142. In other words, in a plan view seen from the top, the rocking axis AX intersects with the line connecting the first operation portion 113 and the first press switch 141 or the second press switch 142 whichever having a longer distance to the first operation portion 113.

When the area E of the operation panel 110 is pressed, the operation panel 110 rocks around a vertex, as a fulcrum, of the first press switch 141 that has a longer distance to the area E among the two press switches 141 and 142 in a plan view seen from the top. At this time, the second press switch 142 is pressed by the holder 120, and a signal related to pressing detection is generated.

When the area G of the operation panel 110 is pressed, the operation panel 110 rocks around the vertex, as a fulcrum, of the second press switch 142 that has a longer distance to the area G among the two press switches 141 and 142 in a plan view seen from the top. At this time, the first press switch 141 is pressed by the holder 120, and a signal related to pressing detection is generated.

Further, in the example as illustrated in FIG. 17, the rocking axis AX intersects with a line L2 that connects the area E and the first press switch 141 having a longer distance to the area E.

As illustrated in FIG. 17, in the input device 100 according to the embodiment, the projection 161-1 is provided at a position overlapping with the rocking axis AX in a plan view seen from the top.

Thus, the input device 100 according to the embodiment can enhance the effect of restraining pressing on the first press switch 141 and the second press switch 142 when the area F is pressed.

Furthermore, as illustrated in FIG. 17, in the input device 100 according to the embodiment, a distance D1 between the projection 161-1 and the first press switch 141 that has a longer distance to the area F among the first press switch 141 and the second press switch 142, is longer than a distance D2 that is a distance between the projection 161-1 and the area F, in a plan view seen from the top.

Thus, the input device 100 according to the embodiment can further enhance the effect of restraining the rocking of the operation panel 110 caused by pressing in the area F and the effect of not restraining the rocking of the operation panel 110 caused by pressing in the area E.

In other words, when the area F is pressed, the operation panel 110 rocks around the vertex, as a fulcrum, of the first press switch 141 that has the longer distance to the area F among the two press switches (141 and 142) in a plan view seen from the top (in the positive Z-axis direction). However, since the projection 161-1 restrains rocking of the operation panel 110, the second press switch 142, that has a shorter distance to the area F, does not detect pressing in the area F.

Effects

As described above, the input device 100 according to the embodiment includes a housing, the operation panel 110 including an operation portion configured to receive touching and pressing from an operator and being supported rockably relative to the housing, the substrate 140 housed in the housing, an electrostatic detection electrode for detecting touching, and the first press switch 141 and the second press switch 142 for detecting pressing. The operation portion includes a first operation portion (areas E and G) that receives touching and pressing, a second operation portion (area F) that receives only touching, and the restrainer 160 configured to differentiate operation that moves the operation panel 110 toward the substrate 140 upon pressing on the first operation portion (areas E and G) from operation that moves the operation panel 110 toward the substrate 140 upon pressing on the second operation portion (area F).

Thus, in the input device 100 according to the embodiment, when the second operation portion (area F) is pressed mistakenly, the operation in which the operation panel 110 moves toward the substrate 140 differs from the operation when the first operation portion (areas E and G) is pressed. Accordingly, an operator can recognize that the second operation portion (area F) is pressed mistakenly due to the difference in the operation. Therefore, according to the input device 100 according to the embodiment, misoperation of the first press switch 141 and the second press switch 142 can be reduced.

Furthermore, in the input device 100 according to the embodiment, the restrainer 160 includes the projection 161-1 extending from the operation panel 110 toward the housing. The projection 161-1 contacts the contact portion 162-1 of the housing when the second operation portion (area F) is pressed to restrain rocking of the operation panel 110, but does not restrain rocking of the operation panel 110 when the first operation portion (areas E and G) is pressed.

Thus, the input device 100 according to the embodiment does not impede rocking of the operation panel 110 when a normal operation is performed on the first operation portion (areas E and G) and restrains rocking of the operation panel 110 when the second operation portion (area F) is operated mistakenly.

The input device according to one embodiment is capable of reducing misoperation of the pressure detector.

Although one embodiment of the present invention has been described in detail above, the present invention is not limited to the embodiment, and various modifications or modifications are possible within the scope of the gist of the invention described in the claims.

What is claimed is:

1. An input device, comprising:
a housing;
an operation panel that includes an operation portion configured to receive touching and pressing from an operator, and is supported so as to be rockable relative to the housing;
a substrate that is housed in the housing;
an electrostatic detection electrode configured to detect the touching; and
a pressure detector configured to detect the pressing, wherein
the operation portion includes
a first operation portion configured to receive both of the touching and the pressing, and
a second operation portion configured to receive only the touching without receiving the pressing, and
the input device includes a restrainer configured to differentiate operation that moves the operation panel toward the substrate upon pressing on the first operation portion from operation that moves the operation panel toward the substrate upon pressing on the second operation portion,
wherein the restrainer includes:
a projection extending from the operation panel toward the housing and a contact portion that is provided in the housing and configured to contact the projection, or
a projection extending from the housing toward the operation panel and a contact portion that is provided in the operation panel and configured to contact the projection, and
upon pressing on the first operation portion, the restrainer is provided so as not to restrain rocking of the operation panel by the projection not contacting the contact portion, and
upon pressing on the second operation portion, the restrainer is provided so as to restrain rocking of the operation panel by the projection contacting the contact portion,
wherein the input device further comprises:
two pressure detectors each being the pressure detector, wherein
upon pressing on the first operation portion, the operation panel rocks around one pressure detector of the two pressure detectors, the one pressure detector serving as a fulcrum and having a longer distance to the first operation portion in a plan view seen from a direction perpendicular to the substrate, and
the pressing on the first operation portion is detected by another pressure detector of the two pressure detectors, the another pressure detector having a shorter distance to the first operation portion, and
wherein in the plan view seen from the direction perpendicular to the substrate, a distance between the projection and one pressure detector of the two pressure detectors, the one pressure detector having a longer distance to the second operation portion, is set longer than a distance between the projection and the second operation portion, and
upon pressing on the second operation portion, the operation panel rocks around the one pressure detector of the two pressure detectors serving as a fulcrum and having the longer distance to the second operation portion in the plan view seen from the direction perpendicular to the substrate, and the rocking of the operation panel is restrained by the projection and the pressing on the second operation portion is not detected by another pressure detector of the two pressure detectors, the another pressure detector having a shorter distance to the second operation portion.

2. The input device according to claim 1, wherein the restrainer includes
two lock portions provided in the housing, the two lock portions being configured as a pair to
define only a rocking direction of the operation panel by supporting both ends of a rocking axis serving as a rocking center, and
lock the operation panel so as to be movable in other directions,
in the plan view seen from the direction perpendicular to the substrate, the rocking axis intersects with a line that connects the first operation portion and one pressure detector of the two pressure detectors, the one pressure detector having a longer distance to the first operation portion, and
in the plan view seen from the direction perpendicular to the substrate, the projection is provided at a position overlapping with the rocking axis.

3. The input device according to claim 1, wherein the restrainer includes
two lock portions provided in the housing, the two lock portions being configured as a pair to
define only a rocking direction of the operation panel by supporting both ends of a rocking axis serving as a rocking center, and
lock the operation panel so as to be movable in other directions,
in the plan view seen from the direction perpendicular to the substrate, the rocking axis intersects with a line that connects the first operation portion and one pressure detector of the two pressure detectors, the one pressure detector having a longer distance to the first operation portion, and
in the plan view seen from the direction perpendicular to the substrate, the projection is provided at a position overlapping with the rocking axis.

4. The input device according to claim 2, wherein in the plan view seen from the direction perpendicular to the substrate, the second operation portion is provided at the position overlapping with the rocking axis.

5. The input device according to claim 3, wherein in the plan view seen from the direction perpendicular to the substrate, the second operation portion is provided at the position overlapping with the rocking axis.

6. The input device according to claim 1, wherein the housing is provided so as to cover the substrate, and rockably supports the operation panel.

7. The input device according to claim 1, wherein the housing is provided so as to cover the substrate, and rockably supports the operation panel.

8. The input device according to claim 1, wherein the housing is provided so as to cover the substrate, and rockably supports the operation panel.

9. The input device according to claim 2, wherein the housing is provided so as to cover the substrate, and rockably supports the operation panel.

10. The input device according to claim 3, wherein the housing is provided so as to cover the substrate, and rockably supports the operation panel.

11. The input device according to claim 4, wherein the housing is provided so as to cover the substrate, and rockably supports the operation panel.

12. The input device according to claim 5, wherein the housing is provided so as to cover the substrate, and rockably supports the operation panel.

* * * * *